(12) United States Patent
Yamaguchi et al.

(10) Patent No.: US 11,594,418 B2
(45) Date of Patent: *Feb. 28, 2023

(54) ETCHING METHOD AND ETCHING APPARATUS

(71) Applicant: TOKYO ELECTRON LIMITED, Tokyo (JP)

(72) Inventors: Kentaro Yamaguchi, Miyagi (JP); Yusuke Takino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/179,502

(22) Filed: Feb. 19, 2021

(65) Prior Publication Data

US 2021/0265169 A1   Aug. 26, 2021

(30) Foreign Application Priority Data

Feb. 21, 2020 (JP) .............................. JP2020-028231

(51) Int. Cl.

| H01L 21/3065 | (2006.01) |
| H01L 21/67 | (2006.01) |
| H01J 37/305 | (2006.01) |
| H01J 37/32 | (2006.01) |

(52) U.S. Cl.
CPC ...... *H01L 21/3065* (2013.01); *H01J 37/3053* (2013.01); *H01J 37/32449* (2013.01); *H01L 21/67069* (2013.01); *H01L 21/67253* (2013.01)

(58) Field of Classification Search
None
See application file for complete search history.

(56) References Cited

U.S. PATENT DOCUMENTS

| 11,361,973 B2* | 6/2022 | Takino | H01L 21/31144 |
| 2008/0286978 A1* | 11/2008 | Chen | H01L 21/30655 |
| | | | 438/713 |
| 2018/0323074 A1* | 11/2018 | Harrison | H01L 21/02057 |
| 2019/0172718 A1* | 6/2019 | Kubota | H01L 21/32139 |
| 2020/0303181 A1* | 9/2020 | Kihara | H01L 21/02274 |
| 2021/0242032 A1* | 8/2021 | Colinjivadi | H01L 21/68785 |

FOREIGN PATENT DOCUMENTS

JP    2009-099938 A    5/2009

* cited by examiner

*Primary Examiner* — Shamim Ahmed
(74) *Attorney, Agent, or Firm* — Weihrouch IP

(57) ABSTRACT

An etching method includes: (a) etching a substrate including an etching target film and a mask formed on the etching target film to form a recess that reaches the etching target film; (b) forming a protective film having a thickness corresponding to one molecular layer on a surface of the recess using a first gas; (c) etching the etching target film with plasma generated from a second gas while leaving the protective film on a side wall of the recess; and (d) repeating (b) and (c).

15 Claims, 8 Drawing Sheets

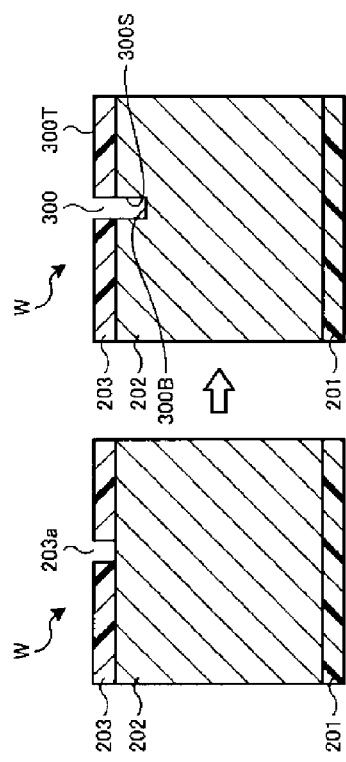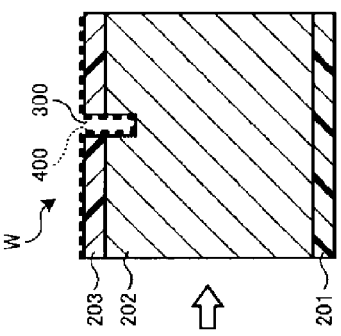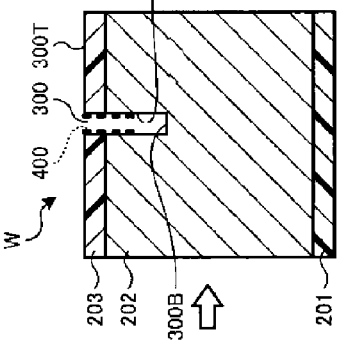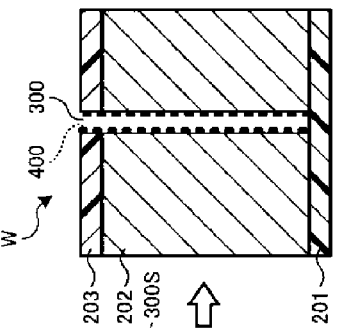

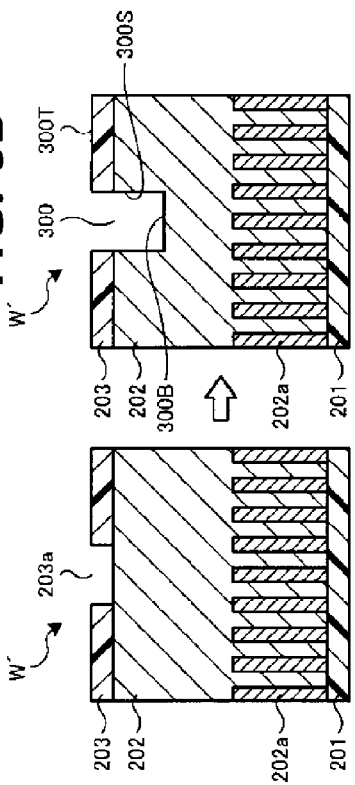
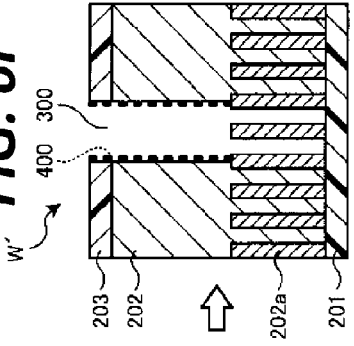
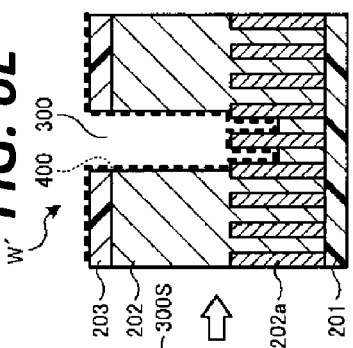
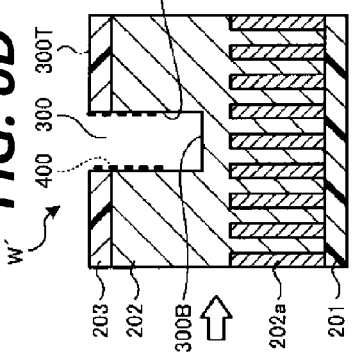
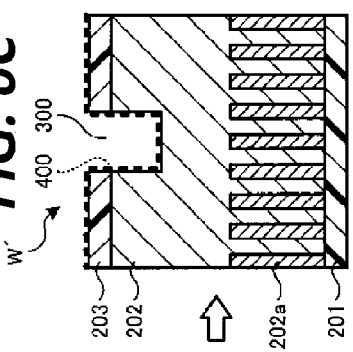

US 11,594,418 B2

ETCHING METHOD AND ETCHING APPARATUS

CROSS-REFERENCE TO RELATED APPLICATIONS

This application is based on and claims priority from Japanese Patent Application No. 2020-028231 filed on Feb. 21, 2020 with the Japan Patent Office, the disclosure of which is incorporated herein in its entirety by reference.

TECHNICAL FIELD

The present disclosure relates to an etching method and an etching apparatus.

BACKGROUND

In the related art, various methods have been proposed to form a pattern having a high aspect ratio on a substrate by etching with high accuracy. For example, a method is proposed in which, when etching an etching target film, a protective film is formed on the opening side wall of the pattern formed in the etching target film to suppress etching in the horizontal direction. See, for example, Japanese Patent Laid-Open Publication No. 2009-099938.

SUMMARY

An etching method according to an aspect of the present disclosure includes a step (a), a step (b), a step (c), and a step (d). In the step (a), a substrate including an etching target film and a mask formed on the etching target film is etched to form a recess that reaches the etching target film. In the step (b), a protective film having a thickness corresponding to one molecular layer is formed on a surface of the recess using a first gas. In the step (c), the etching target film is etched with plasma generated from a second gas while leaving the protective film on a side wall of the recess. In the step (d), the step (b) and the step (c) are repeated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A to 2E are views illustrating an example of a state of a substrate in each step of the etching method according to the embodiment.

FIGS. 6A to 6F are views illustrating an example of a state of a substrate in each step of the etching method according to the modified embodiment.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described in detail with reference to the drawings. In the respective drawings, the same or corresponding parts will be denoted by the same symbols.

It has been known that a shape abnormality occurs when a pattern having a high aspect ratio is formed by etching. For example, a shape abnormality may occur in which the inner peripheral surface of the recess is swollen in the horizontal direction when a recess is formed in the vertical direction. This shape abnormality is called bowing. In order to suppress the occurrence of the shape abnormality, a method of forming a protective film on a side wall of the pattern is proposed. When forming a fine pattern, it is also expected that an opening blockage by the protective film is suppressed.

Example of Flow of Etching Method

Figure 1:
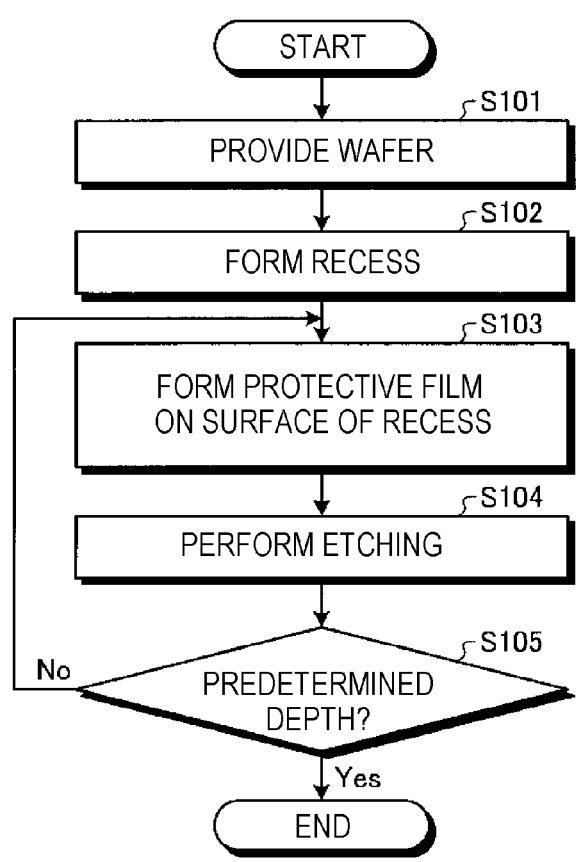
FIG. 1 is a flowchart illustrating an example of flow of an etching method according to an embodiment.

FIG. 1 is a flowchart illustrating an example of flow of an etching method according to an embodiment. FIGS. 2A to 2E are views illustrating an example of a state of a substrate in each step of the etching method according to the embodiment. In the embodiment, a case where the substrate is a semiconductor wafer (hereinafter, referred to as a "wafer") W, and the wafer W is etched will be described as an example.

First, the wafer W is provided (step S101, FIG. 2A). For example, the wafer W in which an etching target film 202 and a mask 203 are formed on a semiconductor substrate 201 in order from the bottom is disposed in a chamber. The etching target film 202 is made of, for example, carbon (C), silicon (Si), or silicon nitride (SiN). The mask 203 is, for example, an anti-reflection film such as Si-ARC. A predetermined pattern is formed in the mask 203. Hereinafter, the pattern formed in the mask 203 will be referred to as an "opening 203a."

Subsequently, the wafer W is etched to form a recess 300 (step S102, FIG. 2B). That is, the recess 300 corresponding to the opening 203a of the mask 203 is formed in the etching target film 202 by etching the wafer W using the mask 203. The etching of the wafer W is performed until the bottom portion of the recess 300 reaches the etching target film 202. The recess 300 includes a bottom portion 300B, a side wall 300S, and a top portion 300T.

Subsequently, a protective film 400 having a thickness corresponding to one molecular layer is formed on the surface of the recess 300 by a first gas (step S103, FIG. 2C). At this time, the protective film 400 is formed using the first gas, which serves as a precursor of atomic layer deposition (ALD). For example, the first gas is supplied to the wafer W, and the molecules of the first gas are adsorbed on the surface of the recess 300, and thus, the protective film 400 is formed. The protective film 400 is made of, for example, a silicon oxide.

Examples of the first gas used to form the protective film 400 may include, for example, an aminosilane-based gas or a silicon alkoxide-based gas. As an aminosilane-based gas, for example, one or more gases selected from bis(tertiary-butylamino)silane (BTBAS), bis(dimethylamino)silane (BDMAS), bis(diethylamino)silane (BDEAS), dimethylaminosilane (DMAS), diethylaminosilane (DEAS), dipropylaminosilane (DPAS), butylaminosilane (BAS), bis(ethylmethylamino)silane (BEMAS), tris(dimethylamino)silane (TDMAS), hexamethyldisilazane (HDMS), dimethylsilyldimethylamine (DMSDMA), dimethylaminotrimethylsilane (TMSDMA), trimethylmethylaminosilane (TMMAS), trimethyl(isocyanato)silane (TMICS), trimethylsilylacetylene (TMSA), and trimethylsilylcyanide (TMSC) are used. As a silicon alkoxide-based gas, for example, tetraethoxysilan (TEOS) is used.

Figure 3:
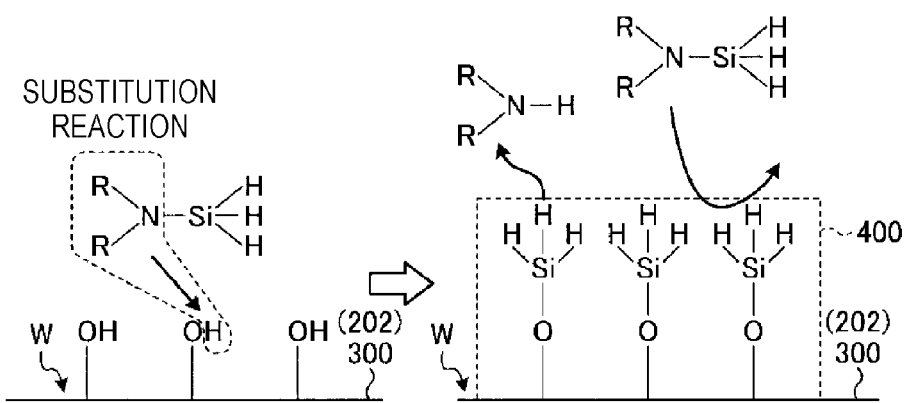
FIG. 3 is a view for explaining in detail a forming step of a protective film of the embodiment.

Here, a forming step of the protective film 400 (step S103, FIG. 2C) will be described in more detail with reference to FIG. 3. FIG. 3 is a view for explaining in detail the forming step of the protective film 400 of the embodiment.

As illustrated on the left side in FIG. 3, for example, when an aminosilane-based gas is supplied to the wafer W as the first gas, a substitution reaction is caused between the hydroxyl groups (OH groups) on the surface of the recess 300 in the etching target film 202 and the molecules of the aminosilane-based gas. That is, a substitution reaction is caused between the amine group portion among the silyl group and the amine group forming the molecule of the aminosilane-based gas, and the OH group on the surface of the recess 300. Then, as illustrated on the right side in FIG. 3, the silyl group is bonded to the oxygen atom of the OH group on the recess 300, and thus, silicon oxide is chemically adsorbed on the surface of the recess 300. Therefore, the protective film 400 having a thickness corresponding to one molecular layer of the silicon oxide is formed on the surface of the recess 300. Since the end of the silyl group is terminated by a hydrogen atom, a substitution reaction with other molecules of the aminosilane-based gas is not caused.

The description will refer back to FIG. 1 and FIGS. 2A to 2E. Subsequently, the etching target film 202 is etched with plasma generated from a second gas while leaving the protective film 400 on the side wall 300S of the recess 300 (step S104, FIG. 2D). For example, the second gas is supplied to the wafer W to generate plasma generated from the second gas, and thus, the etching target film 202 is etched. At this time, the etching target film 202 is etched under a condition that the etching rate corresponding to the side wall 300S of the recess 300 in the etching target film 202 is smaller than the etching rate corresponding to other portions (e.g., top portion 300T and the bottom portion 300B) of the recess 300. For example, processing conditions such as a value of a radio-frequency (RF) power applied are adjusted such that ions are drawn toward the top portion 300T and the bottom portion 300B of the recess 300 and the etching rate of the side wall 300S is reduced. Therefore, the etching target film 202 is removed together with the protective film 400 at the bottom portion 300B of the recess 300 while the side wall 300S of the recess 300 is protected by the protective film 400, and the recess 300 gradually becomes deeper.

The etching of the etching target film 202 may be completed before the protective film 400 is disappeared on the side wall 300S of the recess 300. For example, the protective film 400 may remain on the side wall 300S of the recess 300 by etching the etching target film 202 by adjusting, for example, the etching time. Since the protective film 400 remains on the side wall 300S of the recess 300, the dimension of the recess 300 in the horizontal direction is maintained at the dimension of the opening 203a of the mask 203 after the etching target film 202 is etched. The protective film 400 may not remain during the entire period in which the etching target film 202 is etched. That is, the etching of the etching target film 202 may be completed after a predetermined time is elapsed from the disappearance of the protective film 400 on the side wall 300S of the recess 300.

The second gas used for etching the etching target film 202 differs depending on the film type of the etching target film 202. The second gas is, for example, one or more gases selected from $O_2$, $CO_2$, and CO when the etching target film 202 is made of carbon (C). Further, the second gas is, for example, $HBr/O_2$ when the etching target film 202 is made of silicon (Si). Further, the second gas is, for example, $CH_3F/O_2$ when the etching target film 202 is made of silicon nitride (SiN). For example, carbonyl sulfide (COS) may be added to the second gas.

Further, in the etching of the etching target film 202, the etching of the etching target film 202 and the modifying of the protective film 400 proceeds at the same time by the plasma generated from the second gas. For example, at the same time as the etching of the etching target film 202, the protective film 400 is modified by inducing an oxidation reaction with respect to the protective film 400 by oxygen radicals contained in the plasma generated from the second gas.

Figure 4:
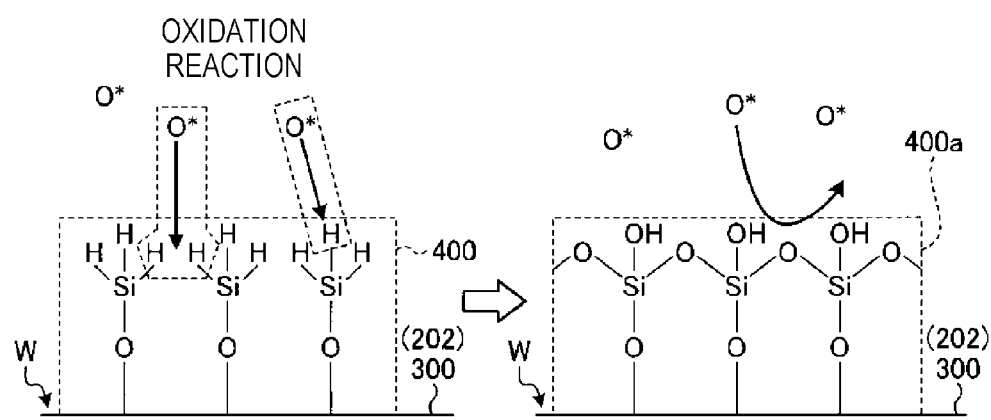
FIG. 4 is a view for explaining in detail modifying of the protective film of the embodiment.

Here, the modifying of the protective film 400 will be described in more detail with reference to FIG. 4. FIG. 4 is a view for explaining in detail the modifying of the protective film 400 of the embodiment.

As illustrated on the left side in FIG. 4, for example, $O_2$ is supplied to the wafer W as the second gas to generate plasma generated from $O_2$, an oxidation reaction with respect to the protective film 400 is caused by oxygen radicals (O*) in the plasma. That is, an oxygen radical (O*) in the plasma is substituted with the hydrogen atom positioned at the end of the silyl group that forms the molecule of the protective film 400, and is bonded to a silicon atom or bridged with the adjacent silyl group, so that the protective film 400 is modified into a protective film 400a, which has stronger etching resistance than the protective film 400. The end of the silyl group is terminated by an oxygen atom or the OH group by modifying the protective film 400, the modified protective film 400a does not cause an oxidation reaction with respect to other oxygen radicals (O*) in the plasma.

The descriptions will refer back to FIG. 1 and FIGS. 2A to 2E. Subsequently, it is determined whether the recess 300 in the etching target film 202 after the etching reaches a predetermined depth (step S105). The determination in step S105 is performed based on, for example, whether steps S103 and S104 are performed a predetermined number of times. When it is determined that the recess 300 does not reach a predetermined depth (No in step S105), steps S103 and S104 are repeated. By repeating steps S103 and S104, the recess 300 reaches a depth that, for example, penetrates the etching target film 202 (FIG. 2E).

Meanwhile, when it is determined that the recess 300 reaches a predetermined depth (Yes in step S105), the processing ends.

As described above, according to the etching method illustrated in FIG. 1 and FIGS. 2A to 2E, the protective film 400 is formed in advance on the pattern side wall (i.e., the side wall 300S of the recess 300) where a shape abnormality such as bowing occurs by etching. Therefore, the occurrence of the shape abnormality of the pattern after etching is suppressed. Further, according to the etching method illustrated in FIG. 1 and FIGS. 2A to 2E, the protective film 400 having a thickness corresponding to one molecular layer is formed on the pattern side wall (i.e., the side wall 300S of the recess 300). Therefore, the film thickness of the protective film 400 may be finely controlled, and thus, the occurrence of opening blockage of the pattern after etching is suppressed.

Modified Embodiment

Figure 5:
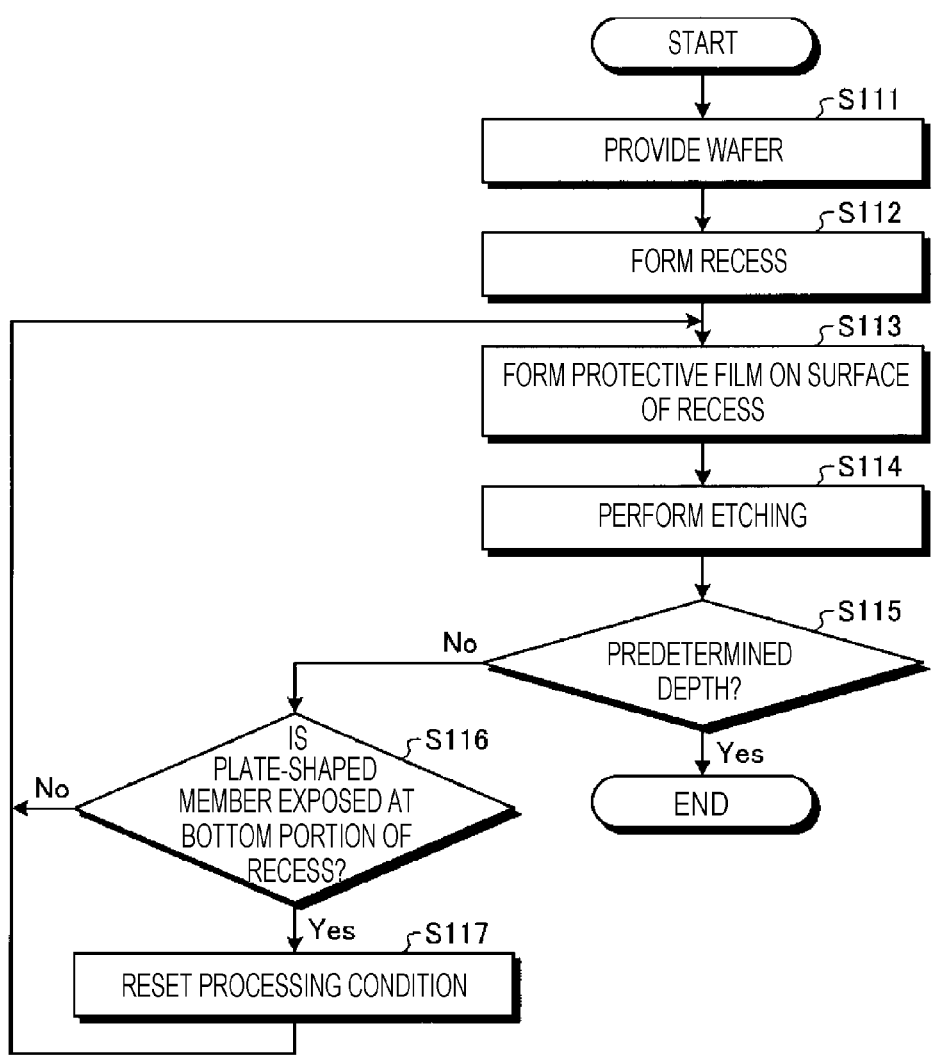
FIG. 5 is a flowchart illustrating an example of flow of an etching method according to a modified embodiment.

In the above embodiment, the case where the substrate (wafer W) in which the etching target film 202 and the mask 203 are formed on the semiconductor substrate 201 in order from the bottom is etched is described. The embodiment may also be modified. FIG. 5 is a flowchart illustrating an example of flow of an etching method according to a modified embodiment. FIGS. 6A to 6F are views illustrating an example of a state of a substrate in each step of the etching method according to the modified embodiment. In the modified embodiment, descriptions will be made on a case where a substrate (wafer W') in which a plurality of plate-shaped members is embedded in the etching target film 202 is etched to remove the etching target film 202 between adjacent plurality of members, based on the method of the embodiment.

First, the wafer W' is provided (step S111, FIG. 6A). For example, the wafer W' in which the etching target film 202 and the mask 203 are formed on the semiconductor substrate 201 in order from the bottom, and additionally, a plurality of plate-shaped members 202a standing straightly from the surface of the semiconductor substrate 201 is embedded in the etching target film 202 is disposed in the chamber. In the wafer W', the opening 203a in the mask 203 has a width larger than the gap between the plate-shaped members 202a. The recess 300 includes the bottom portion 300B, the side wall 300S, and the top portion 300T. The plate-shaped member 202a is, for example, a fin or a gate electrode.

Subsequently, the wafer W' is etched toward the top portion of the plate-shaped member 202a to form the recess 300 having a width larger than the gap between the plate-shaped members 202a (step S112, FIG. 6B). That is, the recess 300 corresponding to the opening 203a of the mask 203 is formed in the etching target film 202 by etching the wafer W' using the mask 203. At this time, since the width of the opening 203a in the mask 203 is larger than the gap between the plate-shaped members 202a, the width of the recess 300 is larger than the gap between the plate-shaped members 202a. The etching of the wafer W' is performed until the bottom portion of the recess 300 reaches the etching target film 202.

Subsequently, a protective film 400 having a thickness corresponding to one molecular layer is formed on the surface of the recess 300 by a first gas (step S113, FIG. 6C). For example, the first gas is supplied to the wafer W', and the molecules of the first gas is adsorbed on the surface of the recess 300, and thus, the protective film 400 is formed. The details of the forming step of the protective film 400 are the same as the forming step illustrated in FIG. 3.

Subsequently, the etching target film 202 is etched with plasma generated from a second gas while leaving the protective film 400 on the side wall 300S of the recess 300 (step S114, FIG. 6D). For example, the second gas is supplied to the wafer W' to generate the plasma generated from the second gas, and thus, the etching target film 202 is etched. The details of the etching of the etching target film 202 are the same as that of the embodiment.

Subsequently, it is determined whether the recess 300 in the etching target film 202 after the etching reaches a predetermined depth (step S115). The determination in step S115 is performed based on, for example, whether steps S113 and S114 are performed a predetermined number of times. When it is determined that the recess 300 has not reached a predetermined depth (No in step S115), it is determined whether the plate-shaped member 202a is exposed at the bottom portion 300b of the recess 300 (step S116). The determination whether the plate-shaped member 202a is exposed may be performed based on the film thickness of the etching target film 202 and the height of the plate-shaped member 202a from the semiconductor substrate 201. Then, when it is determined that the plate-shaped member 202a is exposed at the bottom portion 300B of the recess 300 (Yes in step S116), the processing conditions of step S113 and step S114 are reset (step S117). For example, in step S113, when the processing condition is set such that the protective film 400 is formed on the surface of the recess 300, the processing condition is changed such that the protective film 400 is formed on the surface of the recess 300 and the surface of the exposed plate-shaped member 202a. For example, the processing time of the next step S113 is set to be longer than the processing time of the immediately previous step S113. Further, for example, in step S114, when the processing condition is set such that the protective film 400 remains on the side wall 300S of the recess 400, the processing condition is changed such that the protective film 400 remains on the side wall 300S of the recess 300 and the side wall of the exposed plate-shaped member 202a. For example, the processing time of the next step S114 is set to be longer than the processing time of the immediately previous step S114 to perform so-called over etching. Then, when the processing conditions in step S113 and step S114 are changed, the processing returns to step S113 and step S114, and the protective film 400 is formed and the etching target film 202 is etched, based on the changed processing conditions. That is, the processing returns to step S113, and the protective film 400 is formed on the surface of the recess 300 and the surface of the exposed plate-shaped member 202a. Thereafter, in step S114, the etching target film 202 positioned between adjacent plate-shaped members 202a is etched while leaving the protective film 400 on the side wall 300S of the recess 300 and on the side wall of the exposed plate-shaped member 202a (FIG. 6E). Thereafter, steps S113 and S114 are repeated until the etching target film 202 between the adjacent plate-shaped members 202a is removed.

Meanwhile, when it is determined that the plate-shaped member 202a is not exposed at the bottom portion 300B of the recess 300 (No in step S116), the processing condition is not changed, and the processing returns to step S113 and the step S114.

Meanwhile, when it is determined that the recess 300 reaches a predetermined depth (Yes in step S115), the etching target film 202 between the adjacent plate-shaped members 202a is completely removed, and the shape illustrated in FIG. 6F may be obtained.

As described above, according to the etching method illustrated in FIG. 5 and FIGS. 6A to 6F, after the plate-shaped member 202a is exposed from the bottom portion of the bottom portion 300B of the recess 300, the protective film 400 is formed in advance on the side wall of the plate-shaped member 202a in addition to the pattern side wall. Therefore, the etching target film 202 between the plate-shaped members 202a is removed without damaging the plate-shaped members 202a. Further, according to the etching method illustrated in FIG. 5 and FIGS. 6A to 6F, the protective film 400 having a thickness corresponding to one molecular layer is formed on the side wall of the plate-shaped member 202a in addition to the pattern side wall. Therefore, the film thickness of the protective film 400 may be finely controlled, and thus, the occurrence of opening blockage between the plate-shaped members 202a.

Each step illustrated in FIG. 1 or FIG. 5 may be performed while maintaining a reduced pressure atmosphere in the same processing chamber, or may be consecutively performed in a plurality of different processing chambers connected via a transfer system.

Example of Etching Apparatus

Figure 7:
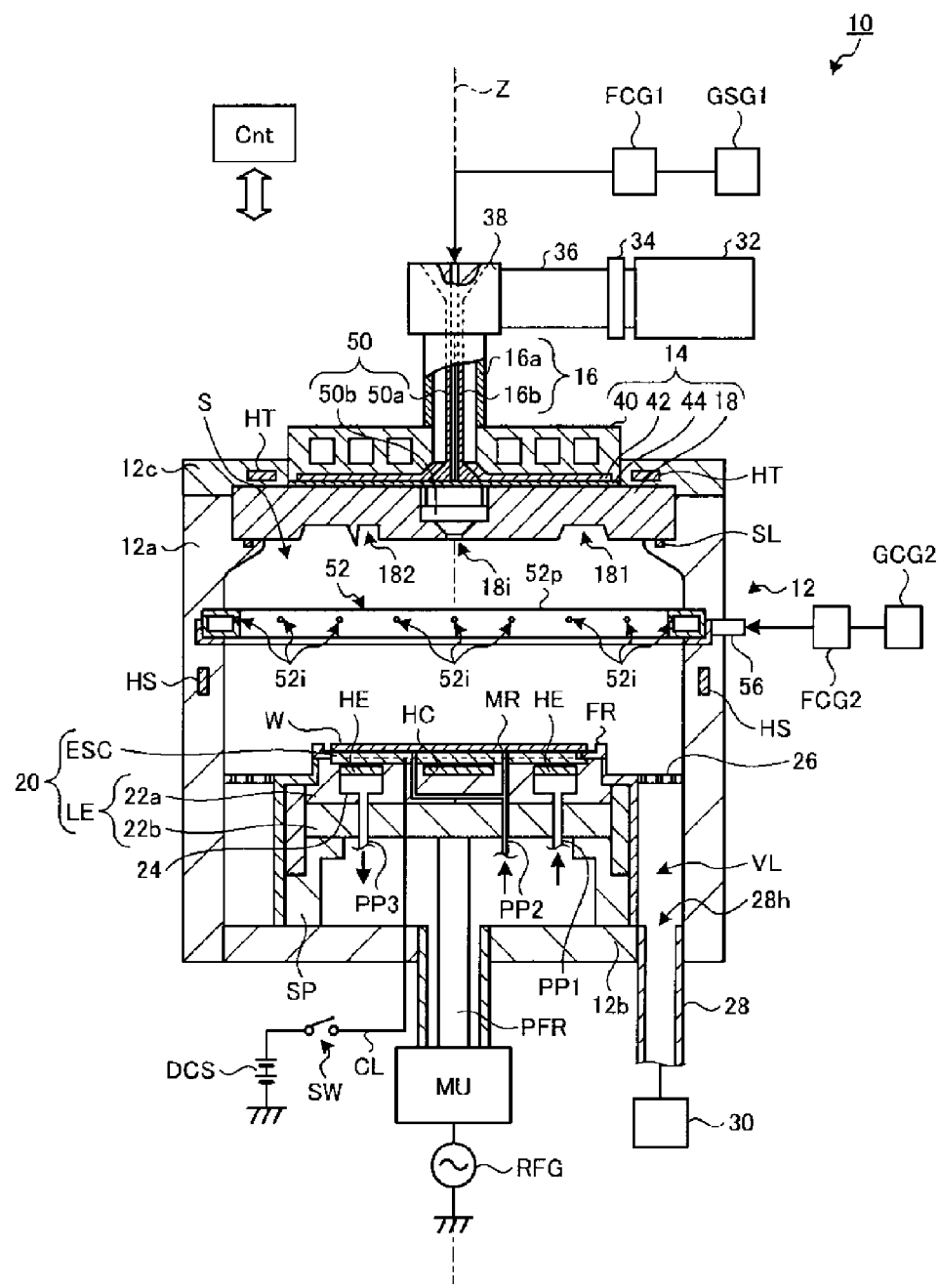
FIG. 7 is a view illustrating an example of an etching apparatus according to an embodiment used for performing an etching method according to an embodiment.

FIG. 7 is a view illustrating an example of an etching apparatus according to an embodiment used for performing the etching method according to the embodiment. FIG. 7 schematically illustrates a cross-sectional structure of an etching apparatus 10. As illustrated in FIG. 7, the etching apparatus 10 includes a chamber 12. The chamber 12 provides a processing space S configured to accommodate the wafer W. The chamber 12 includes a side wall 12a, a bottom portion 12b, and a ceiling 12c. The side wall 12a has a substantially cylindrical shape having the Z axis as an axis. For example, the Z axis passes through the center of a stage (to be described later) in the vertical direction.

The bottom portion 12b is provided at the lower end side of the side wall 12a. Further, the upper end portion of the side wall 12a is opened. The opening of the upper end portion of the side wall 12a is closed by a dielectric window 18. The dielectric window 18 is sandwiched between the upper end portion of the sidewall 12a and the ceiling 12c. A sealing member SL may be interposed between the dielectric window 18 and the upper end portion of the side wall 12a. The sealing member SL is, for example, an O-ring, and contributes to sealing of the chamber 12.

In the chamber 12, a stage 20 is provided below the dielectric window 18. The stage 20 includes a lower electrode LE and an electrostatic chuck ESC. The lower electrode LE includes a first plate 22a and a second plate 22b, for example, made of aluminum and having a substantially disc shape. The second plate 22b is supported by a tubular support SP. The support SP extends vertically upward from the bottom portion 12b. The first plate 22a is provided on the second plate 22b, and electrically connected with the second plate 22b.

The lower electrode LE is electrically connected with a radio-frequency power source RFG via a power feeding rod PFR and a matching unit MU. The radio-frequency power source RFG supplies a radio-frequency bias to the lower electrode LE. The frequency of the radio-frequency bias generated by the radio-frequency power source RFG is a predetermined frequency suitable for controlling the energy of ions drawn to the wafer W, for example, 13.56 MHz. The matching unit MU accommodates a matcher configured to match between the impedance of the radio-frequency power source RFG side and the impedance of the load side such as, mainly, the electrode, the plasma, and the chamber 12. For example, a blocking capacitor for self-bias generation is included in the matcher.

The electrostatic chuck ESC is provided on the first plate 22a. The electrostatic chuck ESC includes a mounting region MR configured to mount the wafer W on the processing space S side. The mounting region MR is a substantially circular region substantially perpendicular to the Z axis, and has a diameter substantially equal to the diameter of the wafer W or a diameter slightly smaller than the diameter of the wafer W. Further, the mounting region MR constitutes the upper surface of the stage 20, and the center of the mounting region MR, that is, the center of the stage 20 is positioned on the Z axis.

The electrostatic chuck ESC holds the wafer W by an electrostatic attraction force. The electrostatic chuck ESC includes an attracting electrode provided in the dielectric. The attracting electrode of the electrostatic chuck ESC is connected with a DC power source DCS via a switch SW and a covered wire CL. The electrostatic chuck ESC attracts and holds the wafer W on the upper surface of the electrostatic chuck ESC by the Coulomb force generated by the DC voltage applied from the DC power source DCS. A focus ring FR is provided radially outside the electrostatic chuck ESC to annularly surround the periphery of the wafer W.

An annular flow path 24 is formed inside the first plate 22a. The flow path 24 is supplied with a coolant from a chiller unit through a pipe PP1. The coolant supplied to the flow path 24 returns to the chiller unit through a pipe PP3. Further, in the etching apparatus 10, a heat transfer gas from a heat transfer gas supply, for example, He gas is supplied between the top surface of the electrostatic chuck ESC and the rear surface of the wafer W through a supply pipe PP2.

A space is formed outside the outer periphery of the stage 20, that is, between the stage 20 and the side wall 12a, and the space serves as an exhaust path VL having an annular shape in plan view. An annular baffle plate 26 including a plurality of through-holes is provided between the exhaust path VL and the processing space S. The exhaust path VL is connected to an exhaust pipe 28 via an exhaust port 28h. The exhaust pipe 28 is provided to the bottom 12b of the chamber 12. An exhaust device 30 is connected to the exhaust pipe 28. The exhaust device 30 includes a pressure adjuster and a vacuum pump such as a turbo molecular pump. The processing space S in the chamber 12 may be decompressed to a desired vacuum degree by the exhaust device 30. Further, the gas supplied to the wafer W flows toward the outside of the edge of the wafer W along the surface of the wafer W by the exhaust device 30, and is exhausted from the outer periphery of the stage 20 through the exhaust path VL.

Further, the etching apparatus 10 of the embodiment includes heaters HT, HS, HC, and HE as temperature control mechanisms. The heater HT is provided in the ceiling 12c, and annularly extends to surround an antenna 14. The heater HS is provided in the side wall 12a, and annularly extends. The heater HC is provided in the first plate 22a or in the electrostatic chuck ESC. The heater HC is provided below the central portion of the mounting region MR described above, that is, in an area intersecting with the Z axis. The heater HE annularly extends to surround the heater HC. The heater HE is provided below the outer edge portion of the mounting region MR described above.

Further, the etching apparatus 10 includes the antenna 14, a coaxial waveguide 16, a microwave generator 32, a tuner 34, a waveguide 36, and a mode converter 38. The antenna 14, the coaxial waveguide 16, the microwave generator 32, the tuner 34, the waveguide 36, and the mode converter 38 constitute a plasma generating unit configured to excite the gas supplied into the chamber 12.

The microwave generator 32 generates microwaves having a frequency of, for example, 2.45 GHz. The microwave generator 32 is connected to the upper portion of the coaxial waveguide 16 via the tuner 34, the waveguide 36, and the mode converter 38. The coaxial waveguide 16 extends along the Z axis, which is a central axis thereof.

The coaxial waveguide 16 includes an outer conductor 16a and an inner conductor 16b. The outer conductor 16a has a cylindrical shape extending around the Z axis. The lower end of the outer conductor 16a is electrically connected to the upper portion of a cooling jacket 40 having a conductive surface. The inner conductor 16b has a cylindrical shape extending around the Z axis, and is provided inside the outer conductor 16a coaxially with the outer conductor 16a. The lower end of the inner conductor 16b is connected to a slot plate 44 of the antenna 14.

In the embodiment, the antenna 14 is a radial line slot antenna (RLSA). The antenna 14 is disposed within an opening formed in the ceiling 12c so as to face the stage 20. The antenna 14 includes the cooling jacket 40, a dielectric plate 42, the slot plate 44, and the dielectric window 18. The dielectric window 18 is an example of an upper ceiling plate. The dielectric plate 42 has a substantially disc shape, and shortens the wavelength of the microwaves. The dielectric plate 42 is made of, for example, quartz or alumina, and is sandwiched between the slot plate 44 and the lower surface of the cooling jacket 40.

Figure 8:
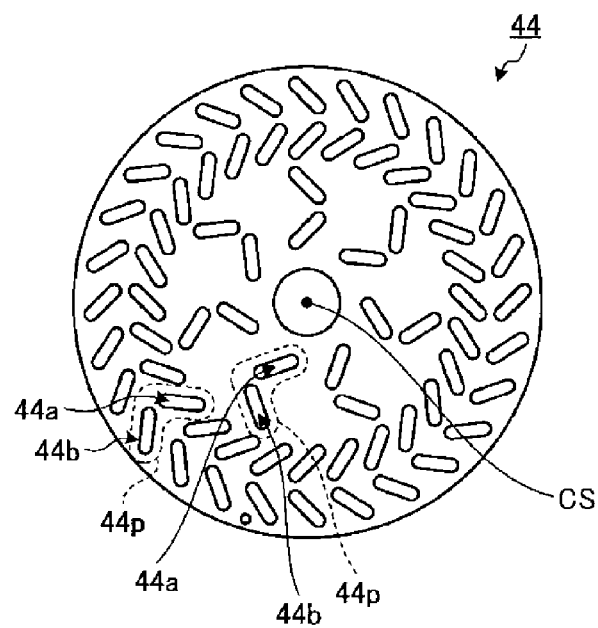
FIG. 8 is a plan view illustrating an example of a slot plate.

FIG. 8 is a plan view illustrating an example of the slot plate 44. The slot plate 44 has a thin plate shape, and a disc shape. Both surfaces of the slot plate 44 in the plate thickness direction are flat, respectively. A center CS of the slot plate 44 is positioned on the Z axis. A plurality of slot pairs 44p is provided in the slot plate 44. Each of the plurality of slot pairs 44p includes two slot holes 44a and 44b penetrating in the plate thickness direction. The planar shape of each of the slot holes 44a and 44b is, for example, an elongated circular shape. In each slot pair 44p, an extending direction of the major axis of the slot hole 44a and an extending direction of the major axis of the slot hole 44b intersect with each other or are perpendicular to each other. The plurality of slot pairs 44p are arranged around the center CS so as to surround the center CS of the slot plate 44. In the example illustrated in FIG. 8, the plurality of slot pairs 44p are arranged along two concentric circles. The slot pairs 44p are substantially equidistantly arranged on each concentric circle. The slot plate 44 is provided on an upper surface 18u on the dielectric window 18 (see, FIG. 10).

Figure 9:
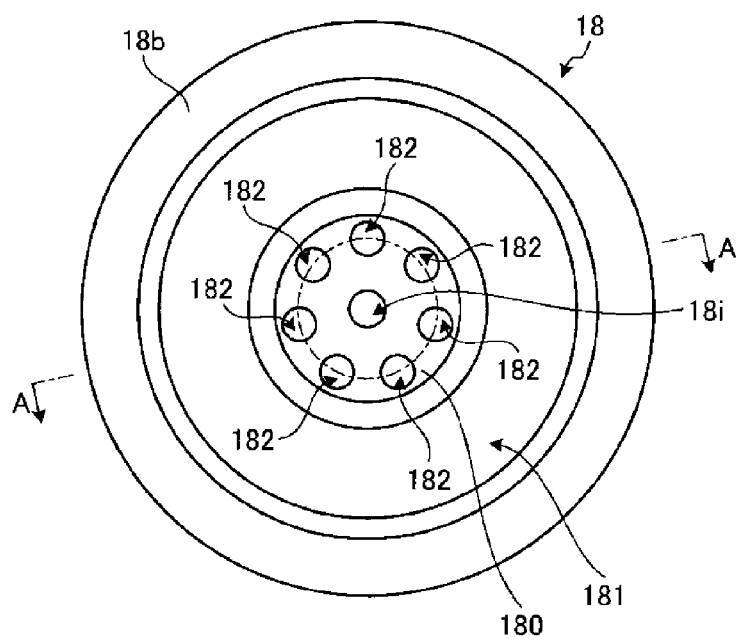
FIG. 9 is a plan view illustrating an example of a dielectric window.
Figure 10:
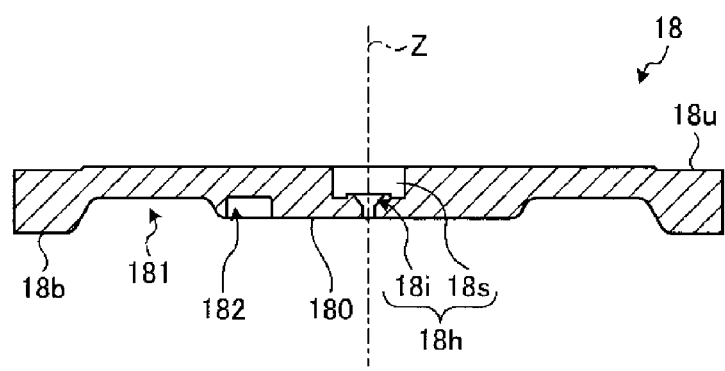
FIG. 10 is a cross-sectional view taken along A-A of FIG. 9.

FIG. 9 is a plan view illustrating an example of the dielectric window 18, and FIG. 10 is a cross-sectional view taken along A-A in FIG. 9. For example, as illustrated in FIGS. 9 and 10, the dielectric window 18 is formed in a substantially disc shape by a dielectric such as quartz. A through-hole 18h is formed in the center of the dielectric window 18. The upper side portion of the through-hole 18h is a space 18s in which an injector 50b of a central introduction unit 50 (to be described) is accommodated, and the lower portion thereof is a gas ejection port 18i of the central introduction unit 50 (to be described). In the embodiment, the central axis of the dielectric window 18 substantially coincides with the Z axis.

A surface on the side opposite to the upper surface 18u of the dielectric window 18, that is, a lower surface 18b faces the processing space S. The lower surface 18b defines various shapes. Specifically, the lower surface 18b has a flat surface 180 in the central region surrounding the gas ejection port 18i. The flat surface 180 is a flat surface perpendicular to the Z axis. The lower surface 18b defines an annular first recess 181. The first recess 181 is annularly continuous in the region radially outside the flat surface 180, and is recessed in a tapered shape from the lower side to the upper side.

Further, the lower surface 18b defines a plurality of second recesses 182. The plurality of second recesses 182 are recessed from the lower side to the upper side. The number of the plurality of second recesses 182 is seven in the example illustrated in FIGS. 9 and 10, but may be six or less, or eight or more. The plurality of second recesses 182 are equidistantly disposed along the circumferential direction. Further, the plurality of second recesses 182 have a circular planar shape in the surface perpendicular to the Z axis.

Figure 11:
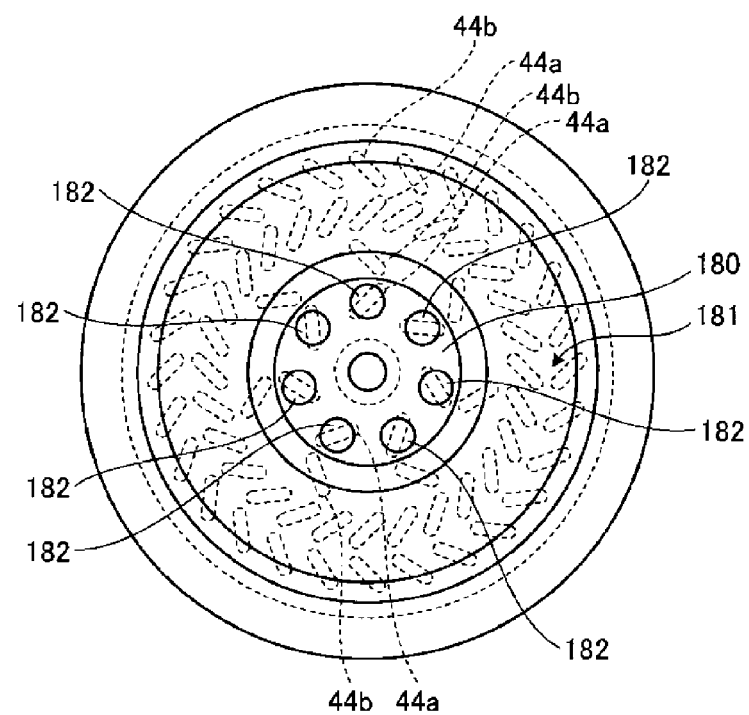
FIG. 11 is a plan view illustrating a state where the slot plate illustrated in FIG. 8 is provided on the dielectric window illustrated in FIG. 9.

FIG. 11 is a plan view illustrating a state where the slot plate 44 illustrated in FIG. 8 is provided on the dielectric window 18 illustrated in FIG. 9. FIG. 11 illustrates a state in which the dielectric window 18 is viewed from the lower side. For example, as illustrated in FIG. 11, in plan view, that is, when viewed in the Z axis direction, the slot pairs 44p provided in the slot plate 44 along the radially outer concentric circle are overlapped with the first recess 181 of the dielectric window 18. Further, the slot holes 44b of the slot pairs 44p provided in the slot plate 44 along the radially inner concentric circle are overlapped with the first recess 181 of the dielectric window 18. Further, the slot holes 44a of the slot pairs 44p formed along the radially inner concentric circle are overlapped with the plurality of second recesses 182.

FIG. 7 is referred to again. The microwaves generated by the microwave generator 32 are propagated to the dielectric plate 42 via the coaxial waveguide 16, and is propagated from the slot holes 44a and 44b in the slot plate 44 to the dielectric window 18. The energy of the microwaves propagated to the dielectric window 18 is concentrated, immediately below the dielectric window 18, in the first recess 181 and the second recess 182 defined by the portion having a relatively thin plate thickness. Therefore, the etching apparatus 10 may generate plasma so as to be stably distributed in the circumferential direction and the radial direction.

Further, the etching apparatus 10 includes the central introduction unit 50 and a peripheral introduction unit 52. The central introduction unit 50 includes a conduit 50a, an injector 50b, and the gas ejection port 18i. The conduit 50a is disposed inside the inner conductor 16b of the coaxial waveguide 16. Further, the end portion of the conduit 50a extends to the inside of the space 18s (see, FIG. 10) of the dielectric window 18 defined by along the Z axis. The injector 50b is accommodated in the space 18s below the end portion of the conduit 50a. The injector 50b includes a plurality of through-holes extending in the Z axis direction. Further, the dielectric window 18 includes the gas ejection port 18i described above. The gas ejection port 18i extends along the Z axis below the space 18s, and communicates with the space 18s. The central introduction unit 50 supplies a gas to the injector 50b via the conduit 50a, and ejects the gas from the injector 50b into the processing space S via the gas ejection port 18i. As described above, the central introduction unit 50 ejects the gas into the processing space S immediately below the dielectric window 18 along the Z axis. That is, the central introduction unit 50 introduces the gas, in the processing space S, to the plasma generation region where the electron temperature is high. Further, the gas ejected from the central introduction unit 50 flows toward the central region of the wafer W along substantially the Z axis. The gas ejection port 18i is an example of a ceiling plate supply port.

The central introduction unit 50 is connected with a gas source group GSG1 via a flow rate control unit group FCG1. The gas source group GSG1 supplies a mixed gas containing a plurality of gases. The flow rate control unit group FCG1 includes a plurality of flow rate control devices and a plurality of opening/closing valves. The gas source group GSG1 is connected with the conduit 50a of the central introduction unit 50 via the flow rate control devices and the opening/closing valves in the flow rate control unit group FCG1.

For example, as illustrated in FIG. 7, the peripheral introduction unit 52 is provided between the gas ejection port 18i of the dielectric window 18 and the upper surface of the stage 20 in the height direction, that is, in the Z axis direction. The peripheral introduction unit 52 introduces a gas into the processing space S from a position along the side wall 12a. The peripheral introduction unit 52 includes a plurality of gas ejection ports 52i. The plurality of gas ejection ports 52i are arranged along the processing space S side of the side wall 12a, between the gas ejection port 18i of the dielectric window 18 and the upper surface of the stage 20 in the height direction.

The peripheral introduction unit 52 includes an annular pipe 52p, for example, made of quartz. The pipe 52p includes the plurality of gas ejection ports 52i. Each of the gas ejection ports 52i ejects a gas obliquely upward in the Z axis direction. The gas ejection port 52i is an example of a side wall supply port. For example, as illustrated in FIG. 7, the peripheral introduction unit 52 of the embodiment includes one pipe 52p. However, as another form, the peripheral introduction unit 52 may include two or more pipes 52p disposed in the vertical direction along the inside of the side wall 12a of the chamber 12. The pipe 52p of the peripheral introduction unit 52 is connected with a gas source group GSG2 via a gas supply block 56 and a flow rate control unit group FCG2. The flow rate control unit group FCG2 includes a plurality of flow rate control devices and a plurality of opening/closing valves. The gas source group GSG2 is connected with the peripheral introduction unit 52 via the flow rate control devices and the opening/closing valves in the flow rate control unit group FCG2. The flow rate control unit groups FCG1 and FCG2, and the gas source groups GSG1 and GSG2 are examples of a supply.

The etching apparatus 10 may independently control the type and the flow rate of the gas supplied from the central introduction unit 50 into the processing space S, and the type and the flow rate of the gas supplied from the peripheral introduction unit 52 into the processing space S. In the embodiment, the etching apparatus 10 supplies a same type of gas into the processing space S from the central introduction unit 50 and the peripheral introduction unit 52. Further, in the embodiment, the flow rate of the gas supplied from the central introduction unit 50 into the processing space S, and the flow rate of the gas supplied from the peripheral introduction unit 52 into the processing space S are set to the substantially same flow rate.

Further, for example, as illustrated in FIG. 1, the etching apparatus 10 includes a controller Cnt including, for example, a processor and a memory. The controller Cnt controls each component of the etching apparatus 10. Specifically, the controller Cnt controls, for example, the selection and the flow rate of the gas supplied from the gas source groups GSG1 and GSG2, the exhaust of the exhaust device 30, the microwave power from the microwave generator 32, and the power supply from the radio-frequency power source RFG, using a control signal. Further, respective steps of the etching method disclosed in the present specification may be performed by operating the respective components of the etching apparatus 10 under the control by the controller Cnt. In the memory of the controller Cnt, a computer program for performing the etching method according to the embodiment, and various data used for performing the method are stored to be readable.

Effect of Embodiment

The etching method according to the embodiment includes a step (a), a step (b), a step (c), and a step (d). In the step (a), a substrate including an etching target film and a mask formed on the etching target film is etched to form a recess that reaches the etching target film. In the step (b), a protective film having a thickness corresponding to one molecular layer is formed on a surface of the recess using a first gas. In the step (c), the etching target film is etched with plasma generated from a second gas while leaving the protective film on a side wall of the recess. In the step (d), the step (b) and the step (c) are repeated. Therefore, the etching method according to the embodiment, the shape abnormality and the opening blockage of the pattern formed by etching may be suppressed.

Further, in the step (b), molecules of the first gas are adsorbed on the surface of the recess to form the protective film. Therefore, in the etching method according to the embodiment, the protective film may be formed without using plasma.

Further, in the step (b), a substitution reaction between a hydroxyl group on the surface of the recess and the molecules of the first gas is caused to form the protective film. Therefore, in the etching method according to the embodiment, the protective film having a thickness corresponding to one molecular layer may be self-controllably formed using a substitution reaction, and the opening blockage due to the protective film may be further suppressed.

Further, the first gas is an aminosilane-based gas or a silicon alkoxide-based gas. Therefore, in the etching method according to the embodiment, the protective film may be self-controllably formed using a substitution reaction between the hydroxyl group on the surface of the recess and molecules of the aminosilane-based gas or the silicon alkoxide-based gas, and the opening blockage due to the protective film may be further suppressed.

Further, the step (c) is completed before the protective film is disappeared on the side wall of the recess. Therefore, in the etching method according to the embodiment, the protective film may remain at a position where a shape abnormality occurs, and the shape abnormality of the pattern may be further suppressed.

Further, in the step (c), the etching target film is etched under a condition that the etching rate of the side wall of the recess is smaller than the etching rate of other portions of the recess. Therefore, in the etching method according to the embodiment, the etching may be performed while protecting the side wall of the recess with the protective film, and the shape abnormality of the pattern may be further suppressed.

Further, in the step (c), an oxidation reaction with respect to the protective film is caused by oxygen radicals contained in the plasma generated from the second gas to etch the etching target film and to modify the protective film at the same time. Therefore, in the etching method according to the embodiment, the protective film may be modified into a modified film having a higher etching resistance, and the shape abnormality of the pattern may be further suppressed.

Further, in the step (a), the substrate in which a plurality of plate-shaped members is embedded in the etching target film is etched toward the top portion of the plate-shaped members to form the recess having a width larger than a gap between the plate-shaped members. In the step (b), after the plate-shaped member is exposed at a bottom portion of the recess by repeating the step (d), the protective film is formed on the surface of the recess and the surface of the exposed plate-shaped member. In the step (c), the etching target film positioned between adjacent plate-shaped members is etched while leaving the protective film on the side wall of the recess and a side wall of the exposed plate-shaped member. In the step (d), the step (b) and the step (c) are repeated until the etching target film positioned between the adjacent plate-shaped members is removed. Therefore, in the etching method according to the embodiment, the etching target film between the plate-shaped members may be removed without damaging the plate-shaped members. Further, in the etching method according to the embodiment, the opening blockage between the plate-shaped members may be suppressed by finely controlling the film thickness of the protective film.

For example, in the embodiment, the microwave plasma processing apparatus using RLSA is described as an example of the etching apparatus 10, but the disclosed technology is not limited thereto. The present disclosure may also be applied to a plasma processing apparatus using another method such as, for example, capacitively coupled plasma (CCP) or inductively coupled plasma (ICP) as long as the apparatus performs a processing using plasma.

According to the present disclosure, it is possible to suppress the shape abnormality and the opening blockage of the pattern formed by etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
    (a) etching a substrate including an etching target film and a mask formed on the etching target film to form a recess that reaches the etching target film;
    (b) forming a protective film having a thickness corresponding to one molecular layer on a surface of the recess using a first gas, wherein the first gas is an aminosilane-based gas or a silicon alkoxide-based gas;
    (c) etching the etching target film with plasma generated from a second gas while leaving the protective film on a side wall of the recess; and
    (d) repeating (b) and (c).

2. The etching method according to claim 1, wherein, in (b), the protective film is formed by adsorbing molecules of the first gas on the surface of the recess.

3. The etching method according to claim 2, wherein, in (b), the protective film is formed by causing a substitution reaction between hydroxyl groups on the surface of the recess and the molecules of the first gas.

4. The etching method according to claim 3, wherein (c) ends before the protective film disappears on the side wall of the recess.

5. The etching method according to claim 4, wherein, in (c), the etching target film is etched under a condition that an etching rate of the side wall of the recess is smaller than an etching rate of other portions of the recess.

6. The etching method according to claim 5, wherein, in (c), the protective film is modified at the same time as the etching of the etching target film, by causing an oxidation reaction with respect to the protective film by oxygen radicals contained in the plasma generated from the second gas.

7. The etching method according to claim 6, wherein, in (a), the substrate in which a plurality of plate-shaped members is embedded in the etching target film is etched toward a top portion of the plate-shaped members to form the recess having a width larger than a gap between the plate-shaped members,
    in (b), after a plate-shaped member is exposed at a bottom portion of the recess by repeating (d), the protective film is formed on the surface of the recess and a surface of the exposed plate-shaped member,
    in (c), the etching target film positioned between adjacent plate-shaped members is etched while leaving the protective film on the side wall of the recess and a side wall of the exposed plate-shaped member, and
    in (d), (b) and (c) are repeated until the etching target film positioned between adjacent plate-shaped members is removed.

8. The etching method according to claim 1, wherein (c) ends before the protective film disappears on the side wall of the recess.

9. The etching method according to claim 1, wherein, in (c), the etching target film is etched under a condition that an etching rate of the side wall of the recess is smaller than an etching rate of other portions of the recess.

10. The etching method according to claim 1, wherein, in (c), the protective film is modified at the same time as the etching of the etching target film, by causing an oxidation reaction with respect to the protective film by oxygen radicals contained in the plasma generated from the second gas.

11. The etching method according to claim 1, wherein, in (a), the substrate in which a plurality of plate-shaped members is embedded in the etching target film is etched toward a top portion of the plate-shaped members to form the recess having a width larger than a gap between the plate-shaped members,
    in (b), after a plate-shaped member is exposed at a bottom portion of the recess by repeating (d), the protective film is formed on the surface of the recess and a surface of the exposed plate-shaped member,
    in (c), the etching target film positioned between adjacent plate-shaped members is etched while leaving the protective film on the side wall of the recess and a side wall of the exposed plate-shaped member, and
    in (d), (b) and (c) are repeated until the etching target film positioned between adjacent plate-shaped members is removed.

12. An etching method comprising:
    (a) providing a substrate including an etching target film and a mask formed on the etching target film, the etching target film having a recess;
    (b) forming a protective film having a thickness corresponding to one molecular layer on a surface of the recess using a first gas, wherein the first gas is an aminosilane-based gas or a silicon alkoxide-based gas;

(c) etching the etching target film with plasma generated from a second gas while leaving the protective film on a side wall of the recess; and
(d) repeating (b) and (c).

13. The etching method according to claim 12, wherein, in (b), the protective film is formed on the surface of the recess and the mask using the first gas.

14. The etching method according to claim 12, wherein the etching target film is made of carbon (C), silicon (Si), or silicon nitride (SiN).

15. The etching method according to claim 12, wherein the mask is an anti-reflection film.

\* \* \* \* \*